(12) United States Patent
Lu et al.

(10) Patent No.: US 12,218,143 B2
(45) Date of Patent: Feb. 4, 2025

(54) ARRAY SUBSTRATE AND MANUFACTURING METHOD THEREOF

(71) Applicant: Shenzhen China Star Optoelectronics Semiconductor Display Technology Co., Ltd., Guangdong (CN)

(72) Inventors: Macai Lu, Guangdong (CN); Jiangbo Yao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 572 days.

(21) Appl. No.: 17/426,907

(22) PCT Filed: May 26, 2021

(86) PCT No.: PCT/CN2021/095939
§ 371 (c)(1),
(2) Date: Jul. 29, 2021

(87) PCT Pub. No.: WO2022/205593
PCT Pub. Date: Oct. 6, 2022

(65) Prior Publication Data
US 2023/0369339 A1    Nov. 16, 2023

(30) Foreign Application Priority Data
Mar. 29, 2021    (CN) .......................... 202110334360.5

(51) Int. Cl.
*H01L 27/12*    (2006.01)

(52) U.S. Cl.
CPC ...... *H01L 27/1222* (2013.01); *H01L 27/1251* (2013.01); *H01L 27/1255* (2013.01); *H01L 27/127* (2013.01)

(58) Field of Classification Search
CPC ............. H01L 27/1222; H01L 27/1251; H01L 27/1255; H01L 27/127; H01L 27/1225;
(Continued)

(56) References Cited

U.S. PATENT DOCUMENTS

2012/0075270 A1    3/2012    Kitakado
2018/0286890 A1    10/2018   Suzumura
(Continued)

FOREIGN PATENT DOCUMENTS

CN    106206622 A    12/2016
CN    108493199 A    9/2018
(Continued)

*Primary Examiner* — Thanh T Nguyen

(57) ABSTRACT

An array substrate and a manufacturing method thereof are provided. The array substrate includes a substrate, an active layer, a first insulating layer, a first metal layer, a second insulating layer, and a second metal layer. The array substrate includes a thin film transistor (TFT) area, and the second metal layer includes a source-drain metal sub-layer located in the TFT area. The TFT area is defined with an active layer exposed area. The array substrate includes a barrier layer, and an orthographic projection of the barrier layer on the active layer at least partially covers an orthographic projection of the active layer exposed area on the active layer.

11 Claims, 3 Drawing Sheets

(58) Field of Classification Search
CPC . H01L 27/1248; H01L 27/1214; H01L 21/77; H01L 27/1259; H01L 27/156; H01L 2021/775; H10K 59/12
See application file for complete search history.

(56) References Cited

U.S. PATENT DOCUMENTS

| | | | |
|---|---|---|---|
| 2019/0252418 A1* | 8/2019 | Kao | H01L 27/127 |
| 2021/0005738 A1 | 1/2021 | Okazaki | |
| 2021/0233978 A1* | 7/2021 | Chen | H01L 27/1229 |
| 2021/0296369 A1* | 9/2021 | Xi | H01L 27/1233 |

FOREIGN PATENT DOCUMENTS

| | | |
|---|---|---|
| CN | 111033757 A | 4/2020 |
| CN | 111788664 A | 10/2020 |
| CN | 112420745 A | 2/2021 |

* cited by examiner

ARRAY SUBSTRATE AND MANUFACTURING METHOD THEREOF

FIELD OF INVENTION

This application relates to a display field, and in particular to an array substrate and a manufacturing method thereof.

BACKGROUND OF INVENTION

With development of display technology, in current-driven display devices such as organic light-emitting diode (OLED) displays, mini light-emitting diodes (mini-LEDs), and micro light-emitting diodes (micro-LEDs), thin film transistors (TFTs) with greater current passing capacity and better device stability are required.

Technical Problem

Currently, top-gate self-aligned oxide semiconductor thin film transistors with higher carrier mobility, less parasitic capacitance, and low leakage current are generally used. However, because the thin film transistor with a top gate structure has no film barrier in an area between a gate and a source and a drain, an active layer is easily permeated by water and oxygen or directly irradiated by light, which affects the performance of thin film transistor (TFT) devices, and reduces weather resistance of the TFT devices.

SUMMARY OF INVENTION

This application provides an array substrate and a manufacturing method thereof to solve the technical problem that current thin film transistors with top gate structures are easily permeated by water and oxygen or directly irradiated by light in the area between the gate and the source and drain, which affects the performance of the thin film transistor (TFT) devices. In order to solve the above problems, the technical solutions provided by this application are as follows:

The present application provides an array substrate, including a substrate, an active layer disposed on the substrate, a first insulating layer disposed on the substrate and the active layer, a first metal layer disposed on the first insulating layer, a second insulating layer disposed on the substrate, the active layer, the first insulating layer, and the first metal layer and covering the first insulating layer and the first metal layer, and a second metal layer disposed on the second insulating layer.

The array substrate includes a TFT area, the first metal layer includes a gate sub-layer located in the TFT area, the second metal layer includes a source-drain metal sub-layer located in the TFT area, the TFT area includes an active layer exposed area located between the gate sub-layer and the source-drain metal sub-layer, the array substrate further includes a barrier layer located above the active layer, and an orthographic projection of the barrier layer on the active layer at least partially covers an orthographic projection of the active layer exposed area on the active layer.

In the array substrate provided by the embodiment of the present application, the barrier layer is disposed on the second insulating layer, and the barrier layer and the second metal layer are formed in the same process.

In the array substrate provided by the embodiment of the present application, the TFT area includes a driving TFT sub-area, and the gate sub-layer includes a first gate located in the driving TFT sub-area, the source-drain metal sub-layer includes a first source and a first drain located in the driving TFT sub-area, the active layer exposed area includes a first exposed sub-area located between the first source and the first gate and a second exposed sub-area located between the first drain and the first gate, the barrier layer includes a first barrier sub-layer, the active layer includes a first active sub-layer located in the driving TFT sub-area.

An orthographic projection of the first barrier sub-layer on the first active sub-layer at least partially covers an orthographic projection of the first exposed sub-area on the first active sub-layer; and/or an orthographic projection of the first barrier sub-layer on the first active sub-layer at least partially covers an orthographic projection of the second exposed sub-area on the first active sub-layer.

In the array substrate provided by the embodiment of the present application, an orthographic projection of the first barrier sub-layer on the first active sub-layer at least partially covers an orthographic projection of the first gate on the first active sub-layer.

In the array substrate provided by the embodiment of the present application, the first barrier sub-layer includes a barrier body disposed above the first gate, a first branch extending from one end of the barrier body to the first exposed sub-area, and a second branch extending from another end of the barrier body to the second exposed sub-area, an orthographic projection of the barrier body on the first active sub-layer covers an orthographic projection of the first gate on the first active sub-layer, and an end of the first branch away from the barrier body is connected to the first source, or an end of the second branch away from the barrier body is connected to the first drain.

In the array substrate provided by the embodiment of the present application, the TFT area includes a switch TFT sub-area, the gate sub-layer includes a second gate located in the switch TFT sub-area, the source-drain metal sub-layer includes a second source and a second drain located in the switch TFT sub-area, the active layer exposed area includes a third exposed sub-area located between the second source and the second gate and a fourth exposed sub-area located between the second drain and the second gate, and the barrier layer includes a second barrier sub-layer, the active layer includes a second active sub-layer located in the switch TFT sub-area. An orthographic projection of the second barrier sub-layer on the second active sub-layer at least partially covers an orthographic projection of the third exposed sub-area on the second active sub-layer, and/or an orthographic projection of the second barrier sub-layer on the second active sub-layer at least partially covers an orthographic projection of the fourth exposed sub-area on the second active sub-layer.

In the array substrate provided by the embodiment of the present application, the second barrier sub-layer includes first sub-segments or second sub-segments arranged at intervals. An orthographic projection of each first sub-segment on the second active sub-layer covers an orthographic projection of the third exposed sub-area on the second active sub-layer, and an orthographic projection of each second sub-segment on the second active sub-layer covers an orthographic projection of the fourth exposed sub-area on the second active sub-layer.

In the array substrate provided by the embodiment of the present application, the first sub-segment is connected to the second source, and the second sub-segment is connected to the second drain; and an end of the first sub-segment away from the second source extends above the second gate, and/or an end of the second sub-segment away from the second drain extends above the second gate.

In the array substrate provided by the embodiment of the present application, the array substrate further includes a storage capacitor area, wherein the first metal layer includes a first electrode plate located in the storage capacitor area, the second metal layer includes a second electrode plate located in the storage capacitor area, and an end of the second electrode plate is connected to the second source or the second drain, and an orthographic projection of the second electrode plate on the substrate at least partially covers an orthographic projection of the first electrode plate on the substrate.

The present application further provides another array substrate, including: a substrate, an active layer disposed on the substrate, a first insulating layer disposed on the substrate and the active layer, a first metal layer disposed on the first insulating layer, a second insulating layer disposed on the substrate, the active layer, the first insulating layer, and the first metal layer and covering the first insulating layer and the first metal layer, and a second metal layer disposed on the second insulating layer.

The array substrate includes a TFT area, the first metal layer includes a gate sub-layer located in the TFT area, the second metal layer includes a source-drain metal sub-layer located in the TFT area. The TFT area includes an active layer exposed area located between the gate sub-layer and the source-drain metal sub-layer. The array substrate further includes a barrier layer located above the active layer, and an orthographic projection of the barrier layer on the active layer at least partially covers an orthographic projection of the active layer exposed area on the active layer.

The barrier layer is disposed on the second insulating layer, and the barrier layer and the second metal layer are formed in the same process.

The TFT area includes a switch TFT sub-area, the gate sub-layer includes a second gate located in the switch TFT sub-area. The source-drain metal sub-layer includes a second source and a second drain located in the switch TFT sub-area. The active layer exposed area includes a third exposed sub-area located between the second source and the second gate and a fourth exposed sub-area located between the second drain and the second gate. The barrier layer includes a second barrier sub-layer, and the active layer includes a second active sub-layer located in the switch TFT sub-area.

An orthographic projection of the second barrier sub-layer on the second active sub-layer at least partially covers an orthographic projection of the third exposed sub-area on the second active sub-layer, and/or an orthographic projection of the second barrier sub-layer on the second active sub-layer at least partially covers an orthographic projection of the fourth exposed sub-area on the second active sub-layer.

In the array substrate provided by the embodiment of the present application, the TFT area includes a driving TFT sub-area, and the gate sub-layer includes a first gate located in the driving TFT sub-area. The source-drain metal sub-layer includes a first source and a first drain located in the driving TFT sub-area. The active layer exposed area includes a first exposed sub-area located between the first source and the first gate and a second exposed sub-area located between the first drain and the first gate. The barrier layer includes a first barrier sub-layer. The active layer includes a first active sub-layer located in the driving TFT sub-area.

An orthographic projection of the first barrier sub-layer on the first active sub-layer at least partially covers an orthographic projection of the first exposed sub-area on the first active sub-layer, and/or an orthographic projection of the first barrier sub-layer on the first active sub-layer at least partially covers an orthographic projection of the second exposed sub-area on the first active sub-layer.

In the array substrate provided by the embodiment of the present application, an orthographic projection of the first barrier sub-layer on the first active sub-layer at least partially covers an orthographic projection of the first gate on the first active sub-layer.

In the array substrate provided by the embodiment of the present application, the first barrier sub-layer includes a barrier body disposed above the first gate, a first branch extending from one end of the barrier body to the first exposed sub-area, and a second branch extending from another end of the barrier body to the second exposed sub-area. An orthographic projection of the barrier body on the first active sub-layer covers an orthographic projection of the first gate on the first active sub-layer, and an end of the first branch away from the barrier body is connected to the first source, or an end of the second branch away from the barrier body is connected to the first drain.

In the array substrate provided by the embodiment of the present application, the second barrier sub-layer includes first sub-segments or second sub-segments arranged at intervals. An orthographic projection of the first sub-segment on the second active sub-layer covers an orthographic projection of the third exposed sub-area on the second active sub-layer, and an orthographic projection of the second sub-segment on the second active sub-layer covers an orthographic projection of the fourth exposed sub-area on the second active sub-layer.

In the array substrate provided by the embodiment of the present application, the first sub-segment is connected to the second source, and the second sub-segment is connected to the second drain. An end of the first sub-segment away from the second source extends above the second gate, and/or an end of the second sub-segment away from the second drain extends above the second gate.

In the array substrate provided by the embodiment of the present application, the array substrate further includes a storage capacitor area, wherein the first metal layer includes a first electrode plate located in the storage capacitor area. The second metal layer includes a second electrode plate located in the storage capacitor area, and an end of the second electrode plate is connected to the second source or the second drain, and an orthographic projection of the second electrode plate on the substrate at least partially covers an orthographic projection of the first electrode plate on the substrate.

The present application also provides a manufacturing method of an array substrate, including following steps:

Providing a substrate, and forming an active layer on the substrate, wherein the array substrate includes a TFT area. Forming a first insulating layer on the substrate and the active layer, and forming a first metal layer on the first insulating layer, wherein the first metal layer includes a gate sub-layer formed in the TFT area. Forming a second insulating layer on the substrate, the active layer, the first insulating layer, and the first metal layer to cover the first insulating layer and the first metal layer. Forming a second metal layer on the second insulating layer, wherein the second metal layer includes a source-drain metal sub-layer formed in the TFT area. Forming a barrier layer above the active layer, wherein the TFT area includes an active layer exposed area located between the gate sub-layer and the source-drain metal sublayer, and an orthographic projection of the barrier layer on the active layer at least partially covers an orthographic projection of the active layer exposed area on the active layer.

In the manufacturing method of the array substrate provided by the embodiment of the present application, the source-drain metal sub-layer and the barrier layer are formed by the same process.

BENEFICIAL EFFECT

In this application, a barrier layer is provided at the active layer exposed area between the gate sub-layer and the source-drain metal sub-layers, so that an orthographic projection of the barrier layer on the active layer at least partially covers an orthographic projection of the active layer exposed area on the active layer. The barrier layer not only plays a role in blocking water and oxygen, but also blocks direct irradiation of light to the active layer at the active layer exposed area. This prevents the structure of the thin film transistor from being permeated by water and oxygen or being directly irradiated by light to affect the performance of the thin film transistor device, thereby improving the weather resistance of the thin film transistor device.

DESCRIPTION OF DRAWINGS

In order to explain the embodiments or the technical solutions in the prior art more clearly, following will briefly introduce the drawings that need to be used in the description of the embodiments or the prior art. Obviously, the drawings in the description are only some embodiments of the invention. For one of ordinary skill in the art, other drawings can be obtained based on these drawings without creative work.

DETAILED DESCRIPTION OF PREFERRED EMBODIMENTS

Figure 1:
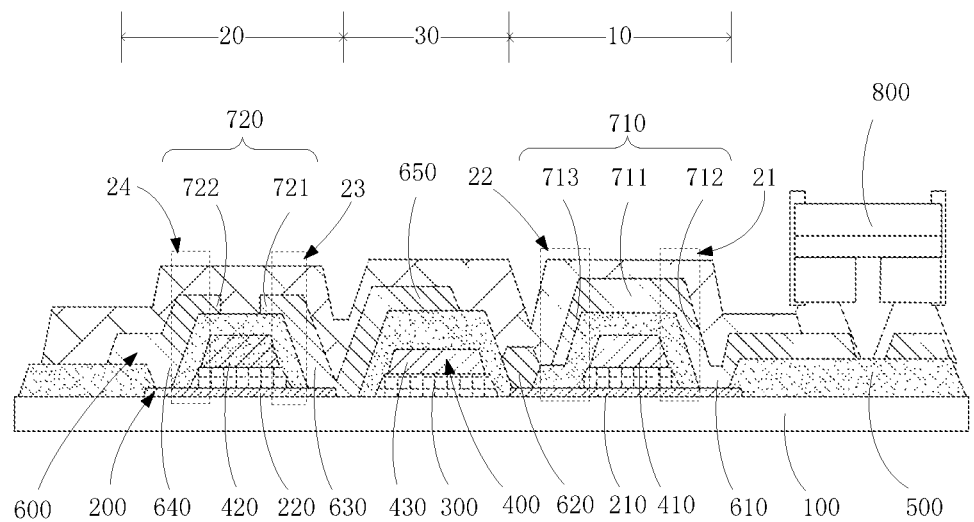
FIG. 1 is a structural schematic diagram of an array substrate in an embodiment of the present application.

The description of the embodiments refers to the attached drawings to illustrate specific embodiments in which the present invention can be implemented. The directional terms mentioned in the present invention, such as "above", "below", "front", "back", "left", "right", "inside", "outside", "side", etc., are only directions for referring to the attached drawings. Therefore, the directional terms are used to describe and understand the present invention, rather than to limit the present invention. In the figure, units with similar structures are indicated by the same reference numerals.

In the description of this application, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise specifically defined.

In the description of the present application, it should be noted that the terms "installation", "connected to", or "connection" should be understood in a broad sense, unless otherwise specified and limited. For example, it can be a fixed connection, a detachable connection, or an integral connection. It can be mechanically connected, electrically connected, or can be communicated with each other. It can be directly connected or indirectly connected through an intermediary. It can be a communication between two elements or an interaction relationship between two elements. For one of ordinary skill in the art, the specific meanings of the above terms in the application can be understood according to specific circumstances.

The technical solution of the present application will be described with reference to the following specific embodiments.

Figure 7:
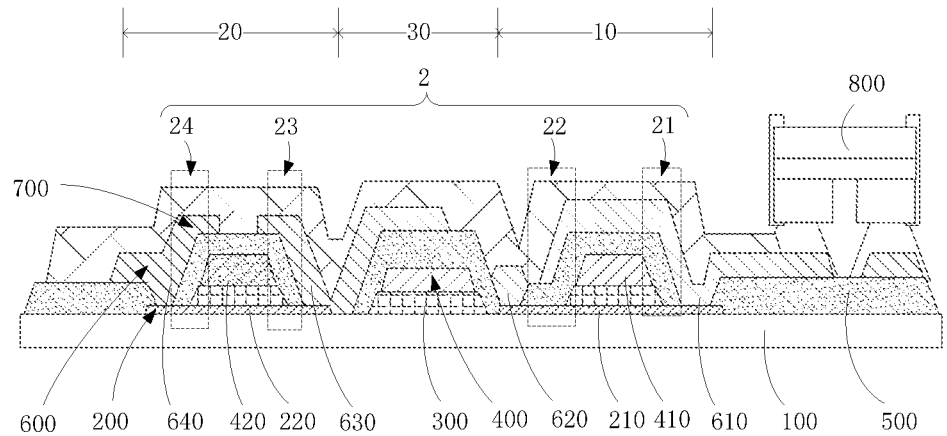

The present application provides an array substrate, as shown in FIG. 1 and FIG. 7. The array substrate includes a substrate 100, an active layer 200 disposed on the substrate 100, a first insulating layer 300 disposed on the substrate 100 and the active layer 200, a first metal layer 400 disposed on the first insulating layer 300, a second insulating layer 500 disposed on the substrate 100, the active layer 200, the first insulating layer 300, and the first metal layer 400 and covering the first insulating layer 300 and the first metal layer 400, and a second metal layer 600 disposed on the second insulating layer 500.

The array substrate includes a TFT area. The first metal layer 400 includes a gate sub-layer located in the TFT area. The second metal layer 600 includes a source-drain metal sub-layer located in the TFT area, and the TFT area includes an active layer exposed area 2 located between the gate sub-layer and the source-drain metal sub-layer. The array substrate includes a barrier layer 700 located above the active layer 200, wherein an orthographic projection of the barrier layer 700 on the active layer 200 at least partially covers an orthographic projection of the active layer exposed area 2 on the active layer 200.

It is understandable that the present current-driven display devices such as organic light-emitting diode displays, mini light-emitting diodes, and micro light-emitting diodes require thin film transistors with larger current passing capacity and better device stability. Therefore, top-gate self-aligned oxide semiconductor thin film transistors with higher carrier mobility, less parasitic capacitance, and low leakage current are generally used. However, because thin film transistors with top gate structures have no film barrier in the area between the gate and the source and drain, an active layer is easily permeated by water and oxygen or directly irradiated by light, which affects the performance of TFT devices, and reduces weather resistance of the TFT devices. In this embodiment, a barrier layer 700 is provided at the active layer exposed area 2 between the gate sub-layer and the source-drain metal sub-layers, so that the orthographic projection of the barrier layer 700 on the active layer 200 at least partially covers the orthographic projection of the active layer exposed area 2 on the active layer 200. The barrier layer 700 not only plays a role in blocking water and oxygen, but also blocks direct irradiation of light to the active layer 200 at the active layer exposed area 2. This prevents the structure of the thin film transistor from being permeated by water and oxygen or directly irradiated by light to affect the performance of thin film transistor devices, thereby improving the weather resistance of the thin film transistor devices.

Figure 2:
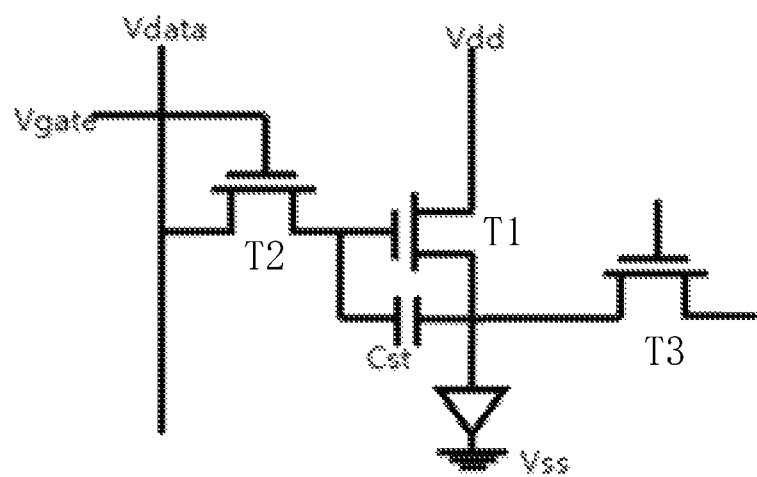
FIG. 2 is a structural schematic diagram of a pixel driving circuit in an embodiment of the present application.

It should be noted that, as shown in FIG. 2, it is a structural schematic diagram of a pixel driving circuit, wherein the pixel driving circuit is used to drive a light-emitting element. Wherein, the pixel driving circuit includes at least a switch thin film transistor T2, a reset detection thin film transistor T3, a storage capacitor $C_{st}$, and a driving thin film transistor T1 for generating a driving current. In this embodiment, the thin film transistors are arranged in the TFT area. Specifically, the switch thin film transistor T2 and the driving thin film transistor T1 can be arranged in the TFT area. Furthermore, the first metal layer 400 may not only include the gate sub-layer, but also may include structures such as gate traces. In addition to the source-drain metal sub-layer, the second metal layer 600 may also include trace structures such as data lines and storage capacitor lines, which are not limited herein.

In one embodiment, the barrier layer 700 is disposed on the second insulating layer 500, and the barrier layer 700 and the second metal layer 600 are formed in the same process. It is understandable that the barrier layer 700 can be made of the same material as the second metal layer 600. Furthermore, the barrier layer 700 and the second metal layer 600 can be formed on the second insulating layer 500 by the same process. Specifically, the material of the barrier layer 700 and the second metal layer 600 can be a metal material or a metal oxide material.

In one embodiment, as shown in FIG. 1 and FIG. 7, the TFT area includes a driving TFT sub-area 10, and the gate sub-layer includes a first gate 410 located in the driving TFT sub-area 10. The source-drain metal sub-layer includes a first source 610 and a first drain 620 located in the driving TFT sub-area 10. The active layer exposed area 2 includes a first exposed sub-area 21 located between the first source 610 and the first gate 410 and a second exposed sub-area 22 located between the first drain 620 and the first gate 410. The barrier layer 700 includes a first barrier sub-layer 710, and the active layer 200 includes a first active sub-layer 210 located in the driving TFT sub-area 10.

The orthographic projection of the first barrier sub-layer 710 on the first active sub-layer 210 at least partially covers the orthographic projection of the first exposed sub-area 21 on the first active sub-layer 210, and/or the orthographic projection of the first barrier sub-layer 710 on the first active sub-layer 210 at least partially covers the orthographic projection of the second exposed sub-area 22 on the first active sub-layer 210.

It can be understood that the first source 610, the first drain 620, and the first barrier sub-layer 710 are arranged in the same layer. The first source 610, the first drain 620, and the first barrier sub-layer 710 can be formed by the same process and have an integrally formed structure. The driving thin film transistor T1 can be provided in the driving TFT sub-area 10. In this embodiment, the driving thin film transistor T1 may include the first gate 410, the first source 610, and the first drain 620. The first source 610 is connected to a mini light-emitting diode 800. The orthographic projection of the first barrier sub-layer 710 on the first active sub-layer 210 at least partially covers the orthographic projection of the first exposed sub-area 21 on the first active sub-layer 210, and/or the orthographic projection of the first barrier sub-layer 710 on the first active sub-layer 210 at least partially covers the orthographic projection of the second exposed sub-area 22 on the first active sub-layer 210 so that the first barrier sub-layer 710 at least partially covers the portion of the first active sub-layer 210 located in the first exposed sub-area 21 and/or the second exposed sub-area 22. It has the effect of blocking water and oxygen and preventing direct light to a certain extent.

In one embodiment, as shown in FIG. 1 to FIG. 2, the orthographic projection of the first barrier sub-layer 710 on the first active sub-layer 210 at least partially covers the orthographic projection of the first gate 410 on the first active sub-layer 210. It is understandable that when the orthographic projection of the first barrier sub-layer 710 on the first active sub-layer 210 at least partially covers the orthographic projection of the first gate 410 on the first active sub-layer 210, the first barrier sub-layer 710 can form a capacitor with the first gate 410. Specifically, as shown in FIG. 2, in the driving thin film transistor T1, when the first gate 410 receives a data voltage signal $V_{data}$ to turn on the first drain 620 and the first drain 620 to drive the display, the capacitance formed by the first barrier sub-layer 710 and the first gate 410 can improve the electrical characteristics such as voltage retention of the driving thin film transistor T1.

In one embodiment, as shown in FIG. 1, the first barrier sub-layer 710 includes a barrier body 711 disposed above the first gate 410, a first branch 712 extending from one end of the barrier body 711 to the first exposed sub-area 21, and a second branch 713 extending from another end of the barrier body 711 to the second exposed sub-area 22. An orthographic projection of the barrier body 711 on the first active sub-layer 210 covers an orthographic projection of the first gate 410 on the first active sub-layer 210. An end of the first branch 712 away from the barrier body 711 is connected to the first source 610, or an end of the second branch 713 away from the barrier body 711 is connected to the first drain 620.

It is understandable that the first barrier sub-layer 710 includes a barrier body 711 disposed above the first gate 410 and a first branch 712 and a second branch 713 respectively extending from both ends of the barrier body 711 to the first exposed sub-area 21 and the second exposed sub-area 22. In this case, the first barrier sub-layer 710 may completely cover the first gate 410. Compared with the first barrier sub-layer 710 partially covering the first gate 410, the capacitance formed by the first barrier sub-layer 710 and the first gate 410 is increased, and the voltage retention and other electrical characteristics of the driving thin film transistor T1 are maximized. In addition, by adopting a structure in which an end of the first branch 712 away from the barrier body 711 is connected to the first source 610 or an end of the second branch 713 away from the barrier body 711 is connected to the first drain 620, the first barrier sub-layer 710 can at least completely cover the orthographic projection of the first exposed sub-area 21 or the second exposed sub-area 22 on the first active sub-layer 210. Specifically, when the end of the first branch 712 away from the barrier body 711 is connected to the first source 610, the first branch 712 in the first barrier sub-layer 710 completely covers the orthographic projection of the first exposed sub-area 21 on the first active sub-layer 210, and when the end of the second branch 713 away from the barrier body 711 is connected to the first drain 620, the second branch 713 in the first barrier sub-layer 710 completely covers the orthographic projection of the second exposed sub-area 22 on the first active sub-layer 210. On the basis of maximizing the improvement of the voltage retention and other electrical characteristics of the driving thin film transistor T1, it also maximizes the shielding area of the first barrier sub-layer 710 to the first active sub-layer 210. This ensures that the first barrier sub-layer 710 has certain water and oxygen barrier and light-shielding effects on the first active sub-layer 210.

It should be noted that the first branch 712, the second branch 713, and the barrier body 711 can be configured in other forms. One of the first branch 712 or the second branch 713 is connected to the barrier body 711, and the other one is spaced apart from the barrier body 711. It may also be that the first branch 712, the second branch 713, and the barrier body 711 are arranged at intervals. In addition, based on the above structure, the orthographic projection of the barrier body 711 on the first active sub-layer 210 can be set to partially cover the orthographic projection of the first gate 410 on the first active sub-layer. In this situation, the orthographic projection of the first branch 712 on the first active sub-layer 210 can be set to completely cover the orthographic projection of the first exposed sub-area 21 on the first active sub-layer 210. In addition, the orthographic projection of the second branch 713 on the first active sub-layer 210 is set to completely cover the orthographic projection of the second exposed sub-area 22 on the first active sub-layer 210, which is not limited herein.

In one embodiment, as shown in FIG. 1, the TFT area includes a switch TFT sub-area 20. The gate sub-layer includes a second gate 420 located in the switch TFT sub-area 20. The source-drain metal sub-layer includes a second source 630 and a second drain 640 located in the switch TFT sub-area 20. The active layer exposed area 2 includes a third exposed sub-area 23 located between the second source 630 and the second gate 420 and a fourth exposed sub-area 24 located between the second drain 640 and the second gate 420. The barrier layer 700 includes a second barrier sub-layer 720, and the active layer 200 includes a second active sub-layer 220 located in the switch TFT sub-area 20. The orthographic projection of the second barrier sub-layer 720 on the second active sub-layer 220 at least partially covers the orthographic projection of the third exposed sub-area 23 on the second active sub-layer 220, and/or the orthographic projection of the second barrier sub-layer 720 on the second active sub-layer 220 at least partially covers the orthographic projection of the fourth exposed sub-area 24 on the second active sub-layer 220.

It can be understood that the second source 630, the second drain 640, and the second barrier sub-layer 720 are arranged in the same layer. The second source 630, the second drain 640, and the second barrier sub-layer 720 can be formed by the same process and have an integrally formed structure. A data switch thin film transistor T2 can be arranged in the switch TFT sub-area 20. In this embodiment, the data switch thin film transistor T2 may include the second gate 420, the second source 630, and the second drain 640. The orthographic projection of the second barrier sub-layer 720 on the second active sub-layer 220 at least partially covers the orthographic projection of the third exposed sub-area 23 on the second active sub-layer 220, and/or the orthographic projection of the second barrier sub-layer 720 on the second active sub-layer 220 at least partially covers the orthographic projection of the fourth exposed sub-area 24 on the second active sub-layer 220 so that the second barrier sub-layer 720 at least partially covers a part of the second active sub-layer 220 located in the third exposed sub-area 23 and/or the fourth exposed sub-area 24. It has the effect of blocking water and oxygen and preventing direct light to a certain extent.

In one embodiment, as shown in FIG. 1, the second barrier sub-layer 720 includes first sub-segments 721 or second sub-segments 722 arranged at intervals. An orthographic projection of the first sub-segment 721 on the second active sub-layer 220 covers an orthographic projection of the third exposed sub-area 23 on the second active sub-layer 220, and an orthographic projection of the second sub-segment 722 on the second active sub-layer 220 covers an orthographic projection of the fourth exposed sub-area 24 on the second active sub-layer 220.

It can be understood that the orthographic projection of the first sub-segment 721 on the second active sub-layer 220 is set to completely cover the orthographic projection of the third exposed sub-area 23 on the second active sub-layer 220, and the orthographic projection of the second sub-segment 722 on the second active sub-layer 220 is set to completely cover the orthographic projection of the fourth exposed sub-area 24 on the second active sub-layer 220. In this way, the second barrier sub-layer 720 can completely cover the part of the second active sub-layer 220 located in the third exposed sub-area 23 and the fourth exposed sub-area 24. This exerts good water and oxygen barrier properties and prevents light from directly irradiating the third exposed sub-area 23 and fourth exposed sub-area 24.

In one embodiment, as shown in FIG. 1, the first sub-segment 721 is connected to the second source 630, and the second sub-segment 722 is connected to the second drain 640. An end of the first sub-segment 721 away from the second source 630 extends above the second gate 420, and/or an end of the second sub-segment 722 away from the second drain 640 extends above the second gate 420.

It is understandable that a data switch thin film transistor T2 can be provided in the switch TFT sub-area 20. In this embodiment, the data switch thin film transistor T2 includes the second gate 420, the second source 630, and the second drain 640. Specifically, the data switch thin film transistor T2 needs to function as a data switch in the pixel circuit, that is, to charge and discharge. In this embodiment, an end of the first sub-segment 721 away from the second source 630 extends above the second gate 420, and/or an end of the second sub-segment 722 away from the second drain 640 extends above the second gate 420. That is, the orthographic projection of the first sub-segment 721 and/or the second sub-segment 722 on the second active sub-layer 220 partially covers the orthographic projection of the second gate 420 on the second active sub-layer 220. In addition, the first sub-segment 721 and the second sub-segment 722 are arranged at intervals, so as to ensure that the second barrier sub-layer 720 does not completely cover the second gate 420 and to prevent the formation of a capacitance between the second barrier sub-layer 720 and the second gate 420 which causes a decrease in the charge and discharge sensitivity of the data switch thin film transistor T2. This ensures the charge and discharge sensitivity of the data switch thin film transistor T2. Specifically, the distance between the first sub-segment 721 and the second sub-segment 722 is greater than 2 um.

It should be noted that an end of the first sub-segment 721 away from the second source 630 extends above the second gate 420, and/or an end of the second sub-segment 722 away from the second drain 640 extends above the second gate 420. It is possible to increase the water and oxygen barrier capacity and the area that blocks direct light rays of the first sub-segment 721 and/or the second sub-segment 722. On the basis of maximizing the prevention of the formation of capacitance with the second gate 420 to reduce the charge and discharge sensitivity of the data switch thin film transistor T2, the water and oxygen blocking capacity and the function of blocking light irradiation of the first sub-segment 721 and the second sub-segment 722 are maximized.

In one embodiment, as shown in FIG. 1, the array substrate further includes a storage capacitor area 30. The first metal layer 400 includes a first electrode plate 430 located in the storage capacitor area 30. The second metal layer 600 includes a second electrode plate 650 located in the storage capacitor area 30. An end of the second electrode plate 650 is connected to the second source 630 or the second drain 640. In this embodiment, an end of the second electrode plate 650 is connected to the second source 630.

The orthographic projection of the second electrode plate 650 on the substrate 100 at least partially covers the orthographic projection of the first electrode plate 430 on the substrate 100.

It can be understood that, as shown in FIG. 1 to FIG. 2, the storage capacitor area 30 can be used to set a storage capacitor $C_{st}$. In this embodiment, the first metal layer 400 includes a first electrode plate 430 located in the storage capacitor area 30, and the second metal layer 600 includes a second electrode plate 650 located in the storage capacitor area 30. The orthographic projection of the second electrode plate 650 on the substrate 100 at least partially covers the orthographic projection of the first electrode plate 430 on the substrate 100. The storage capacitor $C_{st}$ may include the first electrode plate 430 and the second electrode plate 650. Certainly, the orthographic projection of the second electrode plate 650 on the substrate 100 can completely cover the orthographic projection of the first electrode plate 430 on the substrate 100, thereby increasing the facing area of the first electrode plate 430 and the second electrode plate 650. Specifically, the size of the facing area of the first electrode plate 430 and the second electrode plate 650 can be adjusted according to the requirements for the size of the storage capacitor $C_{st}$. In addition, the second electrode plate 650 can also be connected to the second source 630 or the second drain 640, and the second electrode plate 650, the second source 630, and the second drain 640 can be manufactured by the same process and are integrally formed.

Figure 3:
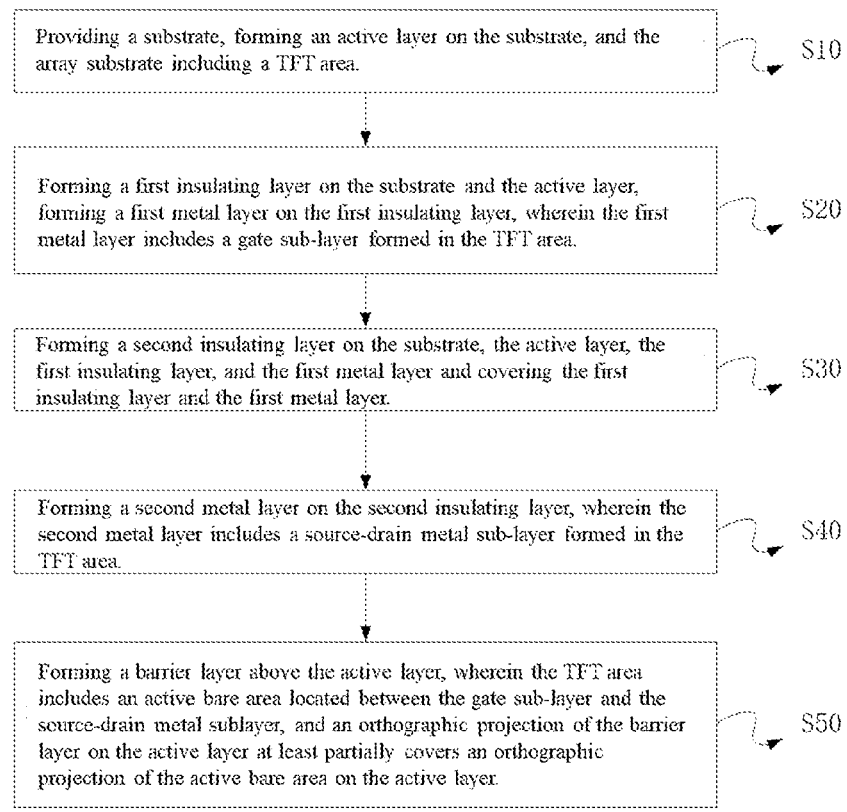
FIG. 3 is a schematic diagram of steps of a manufacturing method of an array substrate in an embodiment of the present application.
Figure 4:
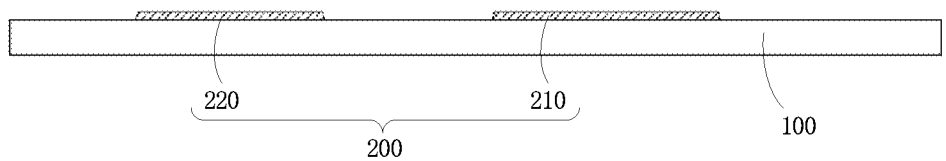
FIG. 4 to FIG. 7 are schematic diagrams of the array substrate in the manufacturing method of the embodiment of the present application.

The present application further provides a manufacturing method of an array substrate, as shown in FIG. 3, including following steps:

S10: As shown in FIG. 4, providing a substrate 100 and forming an active layer 200 on the substrate 100, wherein the array substrate includes a TFT area. Specifically, the active layer 200 can be formed by coating and patterning on the substrate 100. The material of the active layer 200 may be an oxide semiconductor material such as indium gallium zinc oxide (IGZO).

Figure 5:
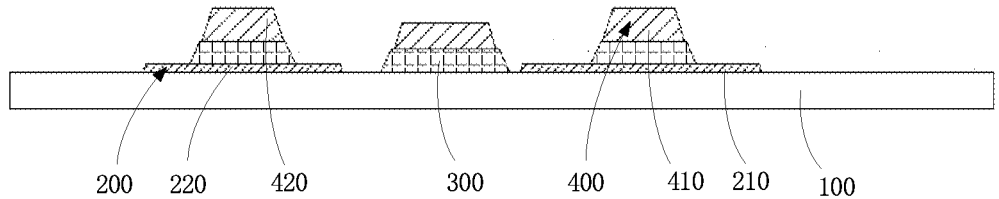

S20: As shown in FIG. 5, forming a first insulating layer 300 on the substrate 100 and the active layer 200, and forming a first metal layer 400 on the first insulating layer 300, wherein the first metal layer 400 includes a gate sub-layer formed in the TFT area. Specifically, the first insulating layer 300 is a gate insulating layer. The first metal layer 400 includes a first gate 410 and a second gate 420 located in the TFT area. The first insulating layer 300 may be formed by patterning using the first gate 410 and the second gate 420 as a mask.

Figure 6:
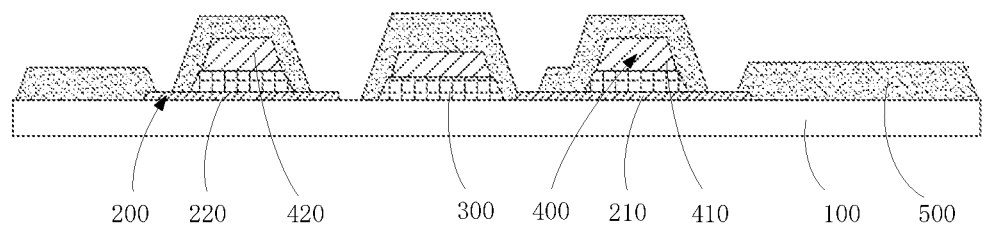

S30: As shown in FIG. 6, forming a second insulating layer 500 on the substrate 100, the active layer 200, the first insulating layer 300, and the first metal layer 400 to cover the first insulating layer 300 and the first metal layer 400.

S40: Forming a second metal layer 600 on the second insulating layer 500, wherein the second metal layer 600 includes a source-drain metal sub-layer formed in the TFT area.

S50: Forming a barrier layer 700 above the active layer 200, wherein the TFT area includes an active layer exposed area 2 located between the gate sub-layer and the source-drain metal sublayer, and an orthographic projection of the barrier layer 700 on the active layer 200 at least partially covers an orthographic projection of the active layer exposed area 2 on the active layer 200.

It is understandable that, as shown in FIG. 7, the material of the source-drain metal sub-layers may be the same as the material of the barrier layer 700. In addition, the source-drain metal sub-layers and the barrier layer 700 are manufactured by the same process, so that the source-drain metal sub-layers and the barrier layer 700 are integrally formed. It prevents the structure of the thin film transistor from affecting the performance of the device due to the penetration of water and oxygen or the direct irradiation of light. On the basis of improving the weather resistance of the thin film transistor device, it also prevents the increase of the production cost caused by the additional processes. In addition, it should be noted that in step S20: After forming the first insulating layer 300 and the first metal layer 400, it may further include a step of metalizing the connecting portions of the active layer 200 and the first source 610, the first drain 620, the second source 630, and the second drain 640.

As described above, in this application, a barrier layer 700 is provided at the active layer exposed area 2 between the gate sub-layer and the source-drain metal sub-layers, so that the orthographic projection of the barrier layer 700 on the active layer 200 at least partially covers the orthographic projection of the active layer exposed area 2 on the active layer 200. The barrier layer 700 not only plays a role in blocking water and oxygen, but also blocks direct irradiation of light to the active layer 200 at the active layer exposed area. This prevents the structure of the thin film transistor from being permeated by water and oxygen or directly irradiated by light to affect the performance of thin film transistor devices, thereby improving the weather resistance of the thin film transistor devices.

As mentioned above, although the present invention has been disclosed in preferred embodiments, the preferred embodiments are not intended to limit the present invention. One of ordinary skill in the art can make various changes and modifications without departing from the spirit and scope of the present invention. Therefore, the protection scope of the present invention is subject to the scope defined by the claims.

What is claimed is:

1. An array substrate, comprising:
a substrate, an active layer disposed on the substrate, a first insulating layer disposed on the substrate and the active layer, a first metal layer disposed on the first insulating layer, a second insulating layer disposed on the substrate, the active layer, the first insulating layer, and the first metal layer and covering the first insulating layer and the first metal layer, and a second metal layer disposed on the second insulating layer;
wherein the array substrate has a thin film transistor (TFT) area, the first metal layer comprises a gate sub-layer located in the TFT area, the second metal layer comprises a source-drain metal sub-layer located in the TFT area, the TFT area comprises an active layer exposed area located between the gate sub-layer and the source-drain metal sub-layer, the array substrate further comprises a barrier layer located above the active layer, and an orthographic projection of the barrier layer on the active layer at least partially covers an orthographic projection of the active layer exposed area on the active layer;
the barrier layer is disposed on the second insulating layer, and the barrier layer and the second metal layer are formed in a same process;
the TFT area comprises a driving TFT sub-area, the gate sub-layer comprises a first gate located in the driving TFT sub-area, the source-drain metal sub-layer comprises a first source and a first drain located in the driving TFT sub-area, the active layer exposed area comprises a first exposed sub-area located between the first source and the first gate and a second exposed sub-area located between the first drain and the first gate, the barrier layer comprises a first barrier sub-layer, and the active layer comprises a first active sub-layer located in the driving TFT sub-area;

an orthographic projection of the first barrier sub-layer on the first active sub-layer at least partially covers an orthographic projection of the first exposed sub-area on the first active sub-layer; and/or the orthographic projection of the first barrier sub-layer on the first active sub-layer at least partially covers an orthographic projection of the second exposed sub-area on the first active sub-layer; and the first barrier sub-layer comprises a barrier body disposed above the first gate, a first branch extending from an end of the barrier body to the first exposed sub-area, and a second branch extending from another end of the barrier body to the second exposed sub-area, and an orthographic projection of the barrier body on the first active sub-layer completely covers an orthographic projection of the first gate on the first active sub-layer.

2. The array substrate according to claim 1,
an end of the first branch away from the barrier body is connected to the first source, or an end of the second branch away from the barrier body is connected to the first drain.

3. The array substrate according to claim 1, wherein the TFT area comprises a switching TFT sub-area, the gate sub-layer comprises a second gate located in the switching TFT sub-area, the source-drain metal sub-layer comprises a second source and a second drain located in the switching TFT sub-area, the active layer exposed area comprises a third exposed sub-area located between the second source and the second gate and a fourth exposed sub-area located between the second drain and the second gate, the barrier layer comprises a second barrier sub-layer, and the active layer comprises a second active sub-layer located in the switching TFT sub-area;

an orthographic projection of the second barrier sub-layer on the second active sub-layer at least partially covers an orthographic projection of the third exposed sub-area on the second active sub-layer; and/or the orthographic projection of the second barrier sub-layer on the second active sub-layer at least partially covers an orthographic projection of the fourth exposed sub-area on the second active sub-layer.

4. The array substrate according to claim 3, wherein the second barrier sub-layer comprises a plurality of first sub-segments or a plurality of second sub-segments arranged at intervals;

an orthographic projection of each of the first sub-segments on the second active sub-layer covers the orthographic projection of the third exposed sub-area on the second active sub-layer; and an orthographic projection of each of the second sub-segments on the second active sub-layer covers the orthographic projection of the fourth exposed sub-area on the second active sub-layer.

5. The array substrate according to claim 4, wherein each of the first sub-segments is connected to the second source, and each of the second sub-segments is connected to the second drain; and an end of each of the first sub-segments away from the second source extends above the second gate; and/or an end of each of the second sub-segments away from the second drain extends above the second gate.

6. The array substrate according to claim 3, further having a storage capacitor area, wherein the first metal layer comprises a first electrode plate located in the storage capacitor area, the second metal layer comprises a second electrode plate located in the storage capacitor area, and an end of the second electrode plate is connected to the second source or the second drain; and an orthographic projection of the second electrode plate on the substrate at least partially covers an orthographic projection of the first electrode plate on the substrate.

7. An array substrate, comprising:
a substrate, an active layer disposed on the substrate, a first insulating layer disposed on the substrate and the active layer, a first metal layer disposed on the first insulating layer, a second insulating layer disposed on the substrate, the active layer, the first insulating layer, and the first metal layer and covering the first insulating layer and the first metal layer, and a second metal layer disposed on the second insulating layer;

wherein the array substrate has a TFT area, the first metal layer comprises a gate sub-layer located in the TFT area, the second metal layer comprises a source-drain metal sub-layer located in the TFT area, the TFT area comprises an active layer exposed area located between the gate sub-layer and the source-drain metal sub-layer, the array substrate further comprises a barrier layer located above the active layer, and an orthographic projection of the barrier layer on the active layer at least partially covers an orthographic projection of the active layer exposed area on the active layer;

the barrier layer is disposed on the second insulating layer, and the barrier layer and the second metal layer are formed in a same process;

the TFT area comprises a switching TFT sub-area, the gate sub-layer comprises a second gate located in the switching TFT sub-area, the source-drain metal sub-layer comprises a second source and a second drain located in the switching TFT sub-area, the active layer exposed area comprises a third exposed sub-area located between the second source and the second gate and a fourth exposed sub-area located between the second drain and the second gate, [and] the barrier layer comprises a second barrier sub-layer, and the active layer comprises a second active sub-layer located in the switching TFT sub-area;

an orthographic projection of the second barrier sub-layer on the second active sub-layer at least partially covers an orthographic projection of the third exposed sub-area on the second active sub-layer; and/or the orthographic projection of the second barrier sub-layer on the second active sub-layer at least partially covers an orthographic projection of the fourth exposed sub-area on the second active sub-layer;

the TFT area comprises a driving TFT sub-area, the gate sub-layer comprises a first gate located in the driving TFT sub-area, the source-drain metal sub-layer comprises a first source and a first drain located in the driving TFT sub-area, the active layer exposed area comprises a first exposed sub-area located between the first source and the first gate and a second exposed sub-area located between the first drain and the first gate, the barrier layer comprises a first barrier sub-layer, and the active layer comprises a first active sub-layer located in the driving TFT sub-area;

an orthographic projection of the first barrier sub-layer on the first active sub-layer at least partially covers an orthographic projection of the first exposed sub-area on the first active sub-layer; and/or the orthographic projection of the first barrier sub-layer on the first active sub-layer at least partially covers an orthographic projection of the second exposed sub-area on the first active sub-layer;

the first barrier sub-layer comprises a barrier body disposed above the first gate, a first branch extending from an end of the barrier body to the first exposed sub-area, and a second branch extending from another end of the barrier body to the second exposed sub-area, and an orthographic projection of the barrier body on the first active sub-layer completely covers an orthographic projection of the first gate on the first active sub-layer; and an end of the first branch away from the barrier body is connected to the first source, or an end of the second branch away from the barrier body is connected to the first drain.

8. The array substrate according to claim 7, wherein the second barrier sub-layer comprises a plurality of first sub-segments or a plurality of second sub-segments arranged at intervals;

an orthographic projection of each of the first sub-segments on the second active sub-layer covers the orthographic projection of the third exposed sub-area on the second active sub-layer; and an orthographic projection of each of the second sub-segments on the second active sub-layer covers the orthographic projection of the fourth exposed sub-area on the second active sub-layer.

9. The array substrate according to claim 8, wherein each of the first sub-segments is connected to the second source, and each of the second sub-segments is connected to the second drain; and an end of each of the first sub-segments away from the second source extends above the second gate; and/or an end of each of the second sub-segments away from the second drain extends above the second gate.

10. The array substrate according to claim 7, further having a storage capacitor area, wherein the first metal layer comprises a first electrode plate located in the storage capacitor area, the second metal layer comprises a second electrode plate located in the storage capacitor area, and an end of the second electrode plate is connected to the second source or the second drain; and an orthographic projection of the second electrode plate on the substrate at least partially covers an orthographic projection of the first electrode plate on the substrate.

11. A manufacturing method of an array substrate, comprising following steps:

providing a substrate and forming an active layer on the substrate, wherein the array substrate comprises a TFT area;

forming a first insulating layer on the substrate and the active layer and forming a first metal layer on the first insulating layer, wherein the first metal layer comprises a gate sub-layer formed in the TFT area;

forming a second insulating layer on the substrate, the active layer, the first insulating layer, and the first metal layer and covering the first insulating layer and the first metal layer;

forming a second metal layer on the second insulating layer, wherein the second metal layer comprises a source-drain metal sub-layer formed in the TFT area; and forming a barrier layer above the active layer, wherein the TFT area comprises an active layer exposed area located between the gate sub-layer and the source-drain metal sub-layer, and an orthographic projection of the barrier layer on the active layer at least partially covers an orthographic projection of the active layer exposed area on the active layer;

wherein the barrier layer is disposed on the second insulating layer, and the barrier layer and the second metal layer are formed in a same process;

the TFT area comprises a driving TFT sub-area, the gate sub-layer comprises a first gate located in the driving TFT sub-area, the source-drain metal sub-layer comprises a first source and a first drain located in the driving TFT sub-area, the active layer exposed area comprises a first exposed sub-area located between the first source and the first gate and a second exposed sub-area located between the first drain and the first gate, the barrier layer comprises a first barrier sub-layer, and the active layer comprises a first active sub-layer located in the driving TFT sub-area;

an orthographic projection of the first barrier sub-layer on the first active sub-layer at least partially covers an orthographic projection of the first exposed sub-area on the first active sub-layer; and/or the orthographic projection of the first barrier sub-layer on the first active sub-layer at least partially covers an orthographic projection of the second exposed sub-area on the first active sub-layer; and the first barrier sub-layer comprises a barrier body disposed above the first gate, a first branch extending from an end of the barrier body to the first exposed sub-area, and a second branch extending from another end of the barrier body to the second exposed sub-area, and an orthographic projection of the barrier body on the first active sub-layer completely covers an orthographic projection of the first gate on the first active sub-layer.

* * * * *